United States Patent
Robles et al.

(10) Patent No.: US 11,843,236 B2
(45) Date of Patent: Dec. 12, 2023

(54) ARC DETECTION SYSTEM AND METHOD FOR AN AIRCRAFT HIGH VOLTAGE AND DIRECT CURRENT ELECTRICAL CIRCUIT

(71) Applicant: Airbus Defence and Space SAU, Getafe (ES)

(72) Inventors: Guillermo Robles, Getafe (ES); Juan Manuel Martínez Tarifa, Getafe (ES); Daniel Izquierdo Gil, Getafe (ES); Gabriel Barroso De María, Getafe (ES); Manuel Gómez De La Calle, Getafe (ES)

(73) Assignee: AIRBUS DEFENCE AND SPACE SAU, Getafe (ES)

( * ) Notice: Subject to any disclaimer, the term of this patent is extended or adjusted under 35 U.S.C. 154(b) by 10 days.

(21) Appl. No.: 17/362,379

(22) Filed: Jun. 29, 2021

(65) Prior Publication Data
US 2022/0006279 A1      Jan. 6, 2022

(30) Foreign Application Priority Data

Jul. 1, 2020   (EP) .................................... 20382594

(51) Int. Cl.
*H02H 1/00*   (2006.01)
*B64F 5/60*    (2017.01)
(Continued)

(52) U.S. Cl.
CPC ............ *H02H 1/0015* (2013.01); *B64F 5/60* (2017.01); *G01R 15/18* (2013.01);
(Continued)

(58) Field of Classification Search
CPC ........ H02H 1/0015; H02H 3/16; H02H 3/006; B64F 5/60; G01R 15/18; G01R 19/0092;
(Continued)

(56) References Cited

U.S. PATENT DOCUMENTS 5,946,179 A  *  8/1999  Fleege ................... G01R 31/52
                                                      361/42
2003/0038640 A1    2/2003  Zuercher et al.
(Continued)

FOREIGN PATENT DOCUMENTS

CN       106054034 A    10/2016
EP        1289091 A2     3/2003
(Continued)

OTHER PUBLICATIONS

Joshua E. Siegel, Shane Pratt, Yongbin Sun, Sanjay E. Sarma, Real-time Deep Neural Networks for internet-enabled arc-fault detection, Engineering Applications of Artificial Intelligence, vol. 74, 2018, pp. 35-42, ISSN 0952-1976, https://doi.org/10.1016/j.engappai.2018.05.009 (Year: 2018).*

(Continued)

*Primary Examiner* — Thienvu V Tran
*Assistant Examiner* — Sreeya Sreevatsa
(74) *Attorney, Agent, or Firm* — Greer, Burns & Crain, Ltd.

(57) ABSTRACT

An arc detection system for an aircraft high voltage and direct current electrical circuit which includes a sensor sensing high-frequency magnetic fields created by current pulses, a signal conditioning block, a database including a time threshold, status signals of events occurring in aircraft normal operation procedures, a processing unit configured to calculate a statistical dispersion of the high-frequency magnetic fields of the current pulses of the signals measured by the sensor, calculate a threshold under no-arc conditions as a function of the previous measured signals, check if the signals measured by the sensor are above the threshold under no arc-conditions during the time threshold, if positive, check if any status signal of events due to normal (Continued)

operation procedures has been activated, and if negative, activate the operation of an electrical protection.

12 Claims, 6 Drawing Sheets

(51) Int. Cl.
    *G01R 15/18*     (2006.01)
    *G01R 19/00*     (2006.01)
    *G01R 31/14*     (2006.01)
    *H02H 3/16*     (2006.01)

(52) U.S. Cl.
    CPC ......... *G01R 19/0092* (2013.01); *G01R 31/14* (2013.01); *H02H 3/16* (2013.01)

(58) Field of Classification Search
    CPC ...... G01R 31/14; G01R 31/008; G01R 31/52; G01R 31/1272
    USPC .......................................................... 361/87
    See application file for complete search history.

(56) References Cited

U.S. PATENT DOCUMENTS

| | | | |
|---|---|---|---|
| 2009/0284265 A1* | 11/2009 | Ohta | H02H 1/0015 |
| | | | 324/536 |
| 2011/0012607 A1 | 1/2011 | Kojori et al. | |
| 2013/0128396 A1* | 5/2013 | Danesh | G01R 23/02 |
| | | | 361/45 |
| 2016/0187407 A1* | 6/2016 | Kolker | G01R 31/52 |
| | | | 324/551 |

FOREIGN PATENT DOCUMENTS

| | | |
|---|---|---|
| EP | 2040348 A2 | 3/2009 |
| EP | 2120306 A2 | 11/2009 |

OTHER PUBLICATIONS

European Search Report; priority document.

\* cited by examiner

ARC DETECTION SYSTEM AND METHOD FOR AN AIRCRAFT HIGH VOLTAGE AND DIRECT CURRENT ELECTRICAL CIRCUIT

CROSS-REFERENCES TO RELATED APPLICATIONS

This application claims the benefit of the European patent application No. 20382594.8 filed on Jul. 1, 2020, the entire disclosures of which are incorporated herein by way of reference.

FIELD OF THE INVENTION

The present invention relates to the field of arc detection systems in aerospace systems. Specifically, it relates to arc detection systems and methods for an aircraft high voltage and direct current electrical circuit.

BACKGROUND OF THE INVENTION

The trend in the new designs of military aircraft and unmanned aircraft is towards a clear growth of electrical power demand. This trend involves an increase of the voltage levels and a rising of the number of electrical key components and equipment, including wiring. Both circumstances boost the appearance of arc faults in this kind of architectures.

A common problem in electrical systems, especially those operating at high voltages, is the formation of arcs. This occurs when a wire frays or a circuit element or trace breaks, or when a bad connection takes place. Since a typical break leaves only a small gap, any current on the path might continue to flow through the path by arcing across the gap, ionizing the surrounding air. The energy and temperature of the arc are very high, and consequently could lead to breakdown and fires. Thus, arc fault events could be catastrophic, so a reliable solution for early detection should be addressed to ensure the safety of the mission and platform.

Unlike Alternating Current (AC) networks, where arc fault tracking is an issue already addressed, serial arc fault detection in Direct Current (DC) is still a problem awaiting solution. This phenomenon is highly difficult to detect by conventional protections, because the current is sustained during the arc and limited only by the connected load. Therefore, arc and load current are similar and in the range of the rated current of the protection. The DC nature of the signal adds the trouble of zero crossing, very useful to the analysis and arc extinction in AC, but that does not exist in DC.

The problem becomes even more complex for the detection of serial arcs. The arc faults can be grouped in serial or parallel, depending on whether the discharge is produced in the same line or involves a different conductor, see FIG. 1. During a serial arc event, the rate of the current remains in nominal values, so is hard for a detector to sense any malfunction.

So far, the intended solutions for arc detection, serial and parallel, in DC architectures present a high rate of false trips, unacceptable in the demanding aerospace standards in terms of reliability. That is why the only mitigation action available nowadays is the updating of design guidelines, including directives to increase the free space inside the distribution boxes to guarantee a greater minimum distance. This practice means a passive method in any case, that increases the weight and volume onboard and does not provide any warning in case of hazardous situations, so the search for active methods of arc fault detection in DC architectures is mandatory for the implementation of more electric aircraft and all electric aircraft.

The known active arc detection developments are based in the energy exchanged between the arc and the environment. These exchanges lead to the following known methodologies used for arc detection:

Optical methods: detecting the light energy emitted by the arc using photodiodes.

Mechanical methods: detecting the pressure waves created by the arc using microphones, piezoelectric or ultrasonic sensors.

Chemical methods: detecting the chemical compounds created when the arc is triggered, like ozone.

Online wire diagnosis: detecting discontinuities in the wires using reflectometry techniques to detect arc faults.

Electrical methods: depending on the sensor used:

Capacitive sensors: measuring the high frequency signals in the Ultra High Frequency Band (UHF) triggered by the arc.

Antennas: These sensors work in the Ultra High Frequency Band (UHF), measuring the electromagnetic wave created by the event.

Inductive sensors: The sensor measures the changes in the magnetic field created by the arc, using the mutual inductance principle. These sensors work in a wide band of frequencies from close to DC to Very High Frequency Band (VHF).

All the related options entail important drawbacks that make them not suitable solutions for an aeronautical High Voltage and Direct Current (HVDC) serial arc fault detector. Optical, mechanical, UHF and chemical methods are only able to detect arcs with sensors located quite close to the arc, but typically it is not possible to know where an arc could occur, and therefore a network involving tens of sensors would be needed. Reflectometry techniques have to cope with signals in online conditions, pulsed signals not related with the arcing and changes in the cable impedance due to connection bifurcations, splicers and equipment connected to the damaged cable. Thus, the identification of the arc source would be difficult, especially for long distances from the sensor and expected wave reflections. They have the additional disadvantage that several radiated noise sources can lead to false positive signals. Furthermore, analyzing UHF signals requires expensive high-speed digitizers.

It is necessary, then, to utilize another physical variable that does not depend on the situation of the arc and could be measured without invasive methods for the signal inside the wiring. The variable used in the present invention is the current pulses flowing through the affected cable during the arc fault.

Inductive sensors seem to be an appropriate tool to identify if the electric circuit is being affected by an arc since they are able to detect conducted signals using non-intrusive methods and lightweight sensors. In addition, they have higher bandwidths which could help in the identification of several phenomena.

The serial arcs can be characterized as an increment of the impedance of the network, which reflects in a decrease of the current feeding the load. The existing detection methods that analyze the changes in the current (some of them with inductive sensors) distinguish the arc using complex data analysis techniques, thus increasing the computing time.

Most of the known solutions presented in the literature use low frequency sensors, i.e., up to 10 kHz, to identify subtle changes in the reduction of current, because of the increment in the impedance created by the series arc. There are works devoted to the measuring of currents in frequencies below 10 kHz that study the characteristics of the current falling with time until the arc is depleted, but these approaches are not valid if the arc is sustained and there is not a clear reduction in the current.

In these previous studies, changes in the current are entirely different depending on the load fed by the source. This would require, for the identification of the arc ignition, a sudden decrease in current, and an estimation of the arc duration and the energy dissipated, to trigger an alert. In addition, extracting information about the arc in low frequency bands is extremely difficult, because in this range is where the pulse width modulation frequencies take place and other environmental noise inherent to the normal operating conditions like opening and closing of contactors, electrical noise, etc. are present. Thus, the studied techniques are not reliable enough to be integrated in an aerial platform.

These limited bandwidths are associated sometimes with complex signal processing algorithms with high computing times and/or difficulties for its application on embedded systems.

Some of the known systems at low frequency analyze changes in the current from DC up to 10 kHz. The processing unit uses a wavelet package decomposition to obtain the energy in the different frequency bands. When the energy ratio is above a preset value, an arc alert is triggered.

It is also known to use a wavelet package decomposition technique to detect the arcs, with a sampling frequency of 200 kHz and proposing a detection method based in the normalized root mean square (RMS) value of the wavelet decomposition coefficients.

Some other known techniques perform an analysis of the signals using a Fourier Transform of a chosen frequency of 100 kHz.

With a different approach, it is known to measure the high frequency current contents when the arcs occur, and then uses spectrograms to analyze the energy of the signal in the different frequency bands. To measure these high frequency signals, a ferrite is used, which is a heavy sensor (around 0.5 kg) and may saturate when it is connected to high current wires. It gives direct indications of arc activity, but the used sensors have heavy weights. Moreover, despite the phenomenon seems to be characterized by means of graphical representation (spectrograms), there is neither analytical approach to lead alarm signals related to arc phenomena nor clear quantification of the magnitudes able to detect this ionization phenomenon.

As a consequence, from the review of state of the art about arc detection devices for HVDC architectures, the following system seems to be lacking:

A light and inexpensive sensor able to catch the feature.
Quick response (in the range of ms).
Detection capability at any location within a distribution network.
Low computing time and sampling frequency.
Detection of the arc while it is active.
High reliability (low rate of false trips).

SUMMARY OF THE INVENTION

The trend in the aeronautical industry, especially in military aircraft, is to move to High Voltage and Direct Current (HVDC) networks. As previously stated, the increment in the voltage levels increases the probability of arc appearance. In order to protect the electrical network, the equipment connected and the aircraft integrity, an arc detection system and method that achieves the restrictive aerospace standards, is claimed.

The present invention is called Arc Detection in Direct Current (ARDID) and is appropriate for Electrical Power and Distribution Networks based on HVDC in military and civil aircraft: mission and weapons systems, electrical propulsion, etc.

The claimed invention fills the gap found in the state of the art for reliable light weight and fast response arc detectors, using a system which analyzes high-frequency signals. This arc detection system comprises the next main elements: (a) a sensor, (b) a signal conditioning block, (c) a database and (d) a processing unit.

The claimed invention uses a system which analyzes high-frequency signals taken, for instance, from an air-cored inductive sensor.

The arc detection system object of the invention comprises:

A sensor configured to measure an analogue signal of high-frequency magnetic fields created by the current pulses of the electrical signal flowing through the electrical circuit. Preferably, an inductive sensor is to be used. More preferably, an inductive loop sensor which is a lighter sensor than shunt or current sensors like Rogowski probes.

A signal conditioning block, performing a signal conditioning stage after the sensing stage. It would receive the raw information captured by the sensor and treat it in order to extract the feature required and dispose the signal in the convenient form to be interpreted for a processing unit. The signal conditioning block comprises an analogue-to-digital converter for converting the analogue signal measured by the sensor (2) into a digital signal.

A database comprising:
  a time threshold setting the time that the conditioned measured signal is held above a set threshold to trigger an alarm,
  status signals of events occurring in aircraft normal operation procedures helping to differentiate false positives such as: conventional switching, transients from power electronics devices, radiated noise, load connections, load impedance changes, etc. The status signal indicates if an event has been activated in the aircraft, for instance, if a switch has been activated.

A processing unit, discerning if the signal from the sensor is an arc or is not, the processing unit is configured to receive:
  the conditioned signal measured by the sensor,
  the time threshold and,
  the status signals of events due to normal operation procedures from the database, The processing unit receives the inputs from the sensor and the database comprising information alerting about normal operation events of the aircraft that could lead to a false trip. Analyzing all these data, the processing unit is able to discern if an arc fault exists and will launch an alert in this case.

The processing unit is configured to:
Calculate a statistical dispersion of the high-frequency magnetic fields of the current pulses in the time domain of the conditioned signals measured by the sensor. In an embodiment the statistical dispersion may be calculated by the standard deviation or the root mean square or the variance or the power or the energy of the high frequency current pulses to measure the dispersion of the measured signals.

Calculate a threshold based on no arc-conditions signals as a function of the statistical dispersion of the high-frequency magnetic fields of the current pulses of the previous conditioned signals measured by the sensor in the aircraft electrical circuit. Thus, the previous signals are signals measured under no-arc conditions, i.e., when there is no arc. In an embodiment, the function may be an average of the previous signals or a regression of the previous signals or a filter of the previous signals. Therefore, it considers the prior measured signals to calculate a threshold under no arc conditions which, in some way, follows the signals being measured by, for instance, performing an average of the past signals. The calculated threshold establishes a reference to detect any increase in the measured signals with respect to the previous signals that might indicate that an arc is occurring.

Check if the statistical dispersion of the high-frequency magnetic fields of the current pulses of the conditioned signals measured by the sensor is above the threshold under no arc-conditions during the time threshold received from the database. If the conditions are met, an alarm is set.

Check from the database if any status signals of events due to normal operation procedures has been activated. This check is performed when the statistical dispersion of the high-frequency magnetic fields of the current pulses in the time domain of the conditioned signal measured by the sensor are above the threshold under no arc-conditions during the time threshold.

Activate the operation of an electrical protection, for instance a switching device, of the aircraft electrical circuit if no status signal of events due to normal operation procedures has been activated. Therefore, if the statistical dispersion of the high-frequency magnetic fields of the current pulses in the time domain of the conditioned signals measured by the sensor are above the threshold under no arc-conditions during the time threshold and no status signal of events has been activated an operation for protecting the electrical circuit is triggered, for instance, an alarm is issued.

According to the above, the claimed invention makes use of database parameters and the current pulses, to detect the existence of an electric arc.

Additionally, this arc detection system is integrated in the electrical network in a non-invasive way, inside a distribution box for example, but not interfering with the wiring signal. The claimed invention takes the information with the sensor and evaluates it continuously, when an arc is detected, an output alert is provided to operate a mechanical contactor or a Solid State Power Controller (SSPC), in order to isolate the circuit.

This feature adds other exclusive capability to the invention, the early detection of the arc while it is still active. Some known systems need to wait until the arc is extinguished to verify it has been produced. By sampling at high frequencies, the system proposed is much faster, order of tens of ms. On the other hand, because the arc detection depends on the current propagated along the wire, the location of the sensor in the proposed invention is independent of the arc occurrence in the circuit.

Therefore, the advantages of this system are the following:

Light weight and volume of the system. A key point for devices onboard.

Early detection of the arc (500 microseconds<t<200 ms).

Detection of the arc while it is still active.

The fast response provided by this system allows a protection of the electrical architectures with conventional switching elements, like mechanical switches. Otherwise, if the response is slow, only fast commuting elements, like SSPC, could be used, to avoid an accumulative delay in the isolation of the failed line. This means the possibility of protecting high power wiring, with hundreds of amperes circulating inside, which cannot be protected with SSPC due to their current limitation.

Additionally, measuring the high frequency pulses in a specific frequency band, for instance, up to 10 MHz allows eliminating false positives, which are outside of the band.

The system is not invasive. It does not require galvanic contact with the power circuit, and do not provoke any interference in the inner electrical signal or physical perturbation for the line.

The sensor does not require being close to the place where the arc is ignited. It detects any arc occurring along any power circuit where it is installed.

The system is independent of the arc frequency pulses, because it detects an increment in a parameter at different frequency ranges when the arc is ignited. There are certain frequency bands of special interest depending on the power cable characteristics (length and diameter) that are more influenced by the arc conditions and can help to set an alarm.

High reliability (low rate of false trips), so match with aerospace demanding standards.

It is also an object of the present invention to provide an arc detection method for an aircraft direct current electrical circuit comprising the following steps:

measuring by a sensor an analogue signal of the high-frequency magnetic fields created by current pulses of an electrical signal flowing through the electrical circuit, converting into a digital signal, in a signal conditioning block, the analogue signal received from the sensor, sending the conditioned signal to a processing unit, calculating in the processing unit a statistical dispersion of the high-frequency magnetic fields of the current pulses in the time domain of the conditioned signals measured by the sensor, calculating in the processing unit a threshold under no arc-conditions as a function of the statistical dispersion of the high-frequency magnetic fields of the current pulses of the conditioned previous signals measured by the sensor, checking in the processing unit if the statistical dispersion of the high-frequency magnetic fields of the current pulses conditioned signals measured by the sensor are above the threshold under no arc-conditions during the time threshold received from the database, checking if any status signals of events due to normal operation procedures from the database has been activated, when the statistical dispersion of the high-frequency magnetic fields of the current pulses in the time domain of the conditioned signals measured by the sensor are above the threshold under no arc-conditions during the time threshold, and activating the operation of an electrical protection of the aircraft electrical circuit if no status signal of events due to normal operation procedures has been activated and if the statistical dispersion of the high-frequency magnetic fields of the current pulses in the time domain of the conditioned signals measured by the sensor are above the threshold under no arc-conditions during the time threshold.

BRIEF DESCRIPTION OF THE DRAWINGS

To complete the description and in order to provide for a better understanding of the invention, a set of drawings is provided. The drawings form an integral part of the description and illustrate preferred embodiments of the invention. The drawings comprise the following figures.

DETAILED DESCRIPTION OF THE PREFERRED EMBODIMENTS

Figure 1:
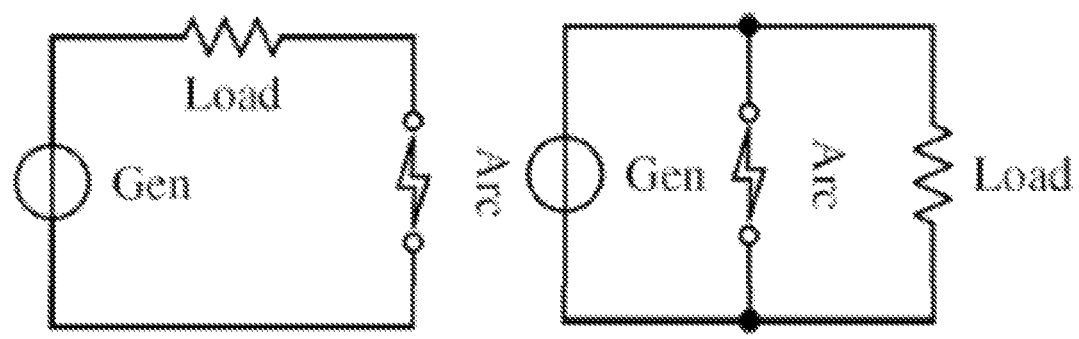
FIG. 1 shows a block diagram of an arcing fault in circuits with single load a) series arc fault and b) parallel arc fault.
Figure 2:
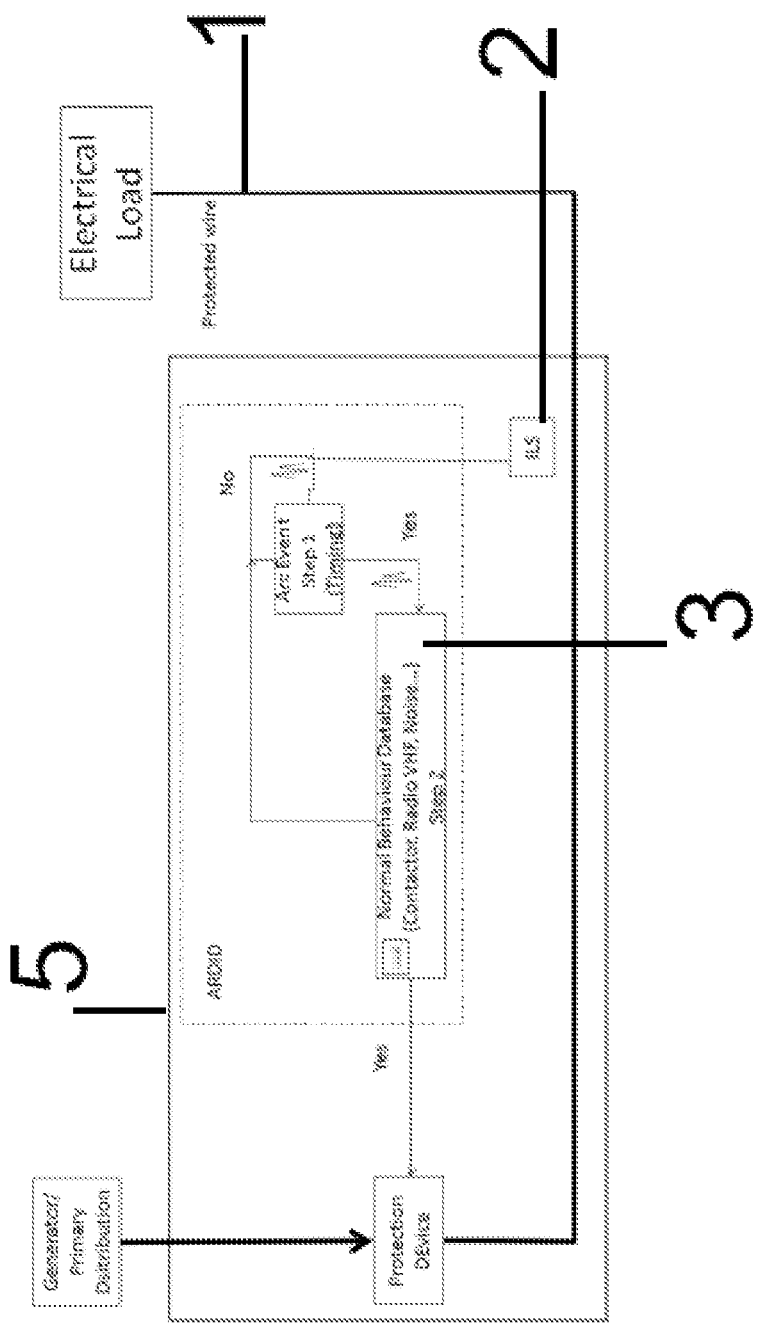
FIG. 2 shows a block diagram of a system according to an embodiment of the invention.

The claimed system is an arc fault detector for high voltage direct current (HVDC) networks that evaluates the high frequency pulses of the current through the wiring, processes the signal in order to clarify with high reliability if an arc takes place and launches an alert for isolating the circuit in case of fault.

This system comprises (a) a sensor, (b) a signal conditioning block, (c) a database and (d) a processing unit.

The claimed system comprises:

A sensor (2) configured to measure high-frequency magnetic fields created by current pulses of the electrical signal flowing through the electrical circuit (1).

There are high frequency components in the current that unveil the arc activity. These high frequency pulses travel along the cable so they can be detected at any point independently from their origin. It is advisable the use of a high frequency current sensor tuned in the band of frequencies of the pulses that propagate along the power cable. Thus, the claimed invention proposes the use of a sensor capable of reading the high frequency magnetic fields created by the current pulses.

In the embodiment shown in the figures, the sensor (2) is an Inductive Loop Sensor (ILS). The inductive Loop Sensor (ILS) is a high frequency sensor (2) currently used to measure partial discharges. It measures conducted current through the electrical circuit (1) monitored by means of magnetic induction. The ILS has shown good sensitivity to detect high frequency current pulses.

One of the advantages of this type of sensor (2) is the galvanic isolation that permits a measurement of the physical variable of interest without the need of a direct contact.

The inductive loop is a lightweight sensor (2) with an air core, suitable for the aeronautical industry and it provides a good linearity, even when the current is high.

The sensibility of the sensor (2) can be optimized based on the bandwidth and sensitivity of interest, enhancing the detection of the high frequency pulses generated by the arc. The geometrical parameters (length, width, number of loops and output impedance) can be optimized in order to obtain the desired bandwidth and sensitivity. This results in a wider applicability of the system to trigger an alert and/or operate a contactor.

The sensor (2) shows a high-pass behavior in the High Frequency (HF) range, which prevents noise coupling from Low Frequency sources, such as commutation in the kHz range or 400 Hz.

This sensor (2) comprises one or more loops placed along the conductor and at both sides in one or several layers to comply with the specifications of bandwidth and sensitivity for the pulses reading. These loops are rectangular and co-planar with the conductor and can be wound around a frame or can be printed on a circuit board with a selected geometry and output impedance. The width and especially the length of the defined rectangle influence the sensor sensitivity. In both cases, the sensor (2) is non-intrusive since the frame has a rail to berth the conductor in the first case or it is printed beside the conductor in the second design.

Using a double loop at both sides of the conductor would multiply the conducted pulses while reduce the external RF interferences affecting perpendicularly to the plane of the loops.

Finally, a secure distance has to be held between the set sensor (2) and cable under test and other cables so avoid crosstalk.

The distance to the main conductor has to be as low as possible considering the shielding and the insulation between high voltage and ground constraints.

An amplification stage might be necessary, it should be designed to work up to 10 MHz and connected directly to the output of the sensor (2), otherwise, it would also amplify external and unnecessary interferences.

The sensor (2) has low weight, <200 gr, and low volume, for the current prototype, which fits aeronautical applications.

The output of the sensor (2) may be connected to a coaxial cable to the conditioning stage.

A signal conditioning block (4) is disposed at the sensor (2) output to convert the signal into a convenient form to be received for the processing unit (5). It comprises an analogue to digital converter for converting the analogue signal measured by the sensor (2) into a digital signal.

It may comprise a filter configured to select a band of frequencies ranging up to 50 MHz from the measure signal and configured to feed the processing unit (5).

In this phase, the output of the sensor (2) is converted to a digital signal using the analog to digital converter. The standard input channel of the converter can be either 50 Ohm or 1 MOhm, this means that the load impedance of the sensor (2) ranges between these two values. The interest of the sensor (2) is to have the highest sensitivity to any incoming pulse. In this way, it may be interesting to set a load impedance optimized to take advantage of the inductive characteristics of the coil and improve the sensitivity.

As previously stated, included is a low pass filter with a cut-off frequency in 50 MHz and, even lower if the length of the main conductor is larger than 10 m. Notice that the longer the main conductor is, the lower the frequency components would have the pulsed signal. This may reduce some noise source interferences.

The 50 MHz low pass filter can also serve as antialiasing filter as long as the sampling frequency is set below 100 MSps. Since the frequencies of interest are below 10 MHz, the sampling frequency is set to 20 MSps.

Figure 3:
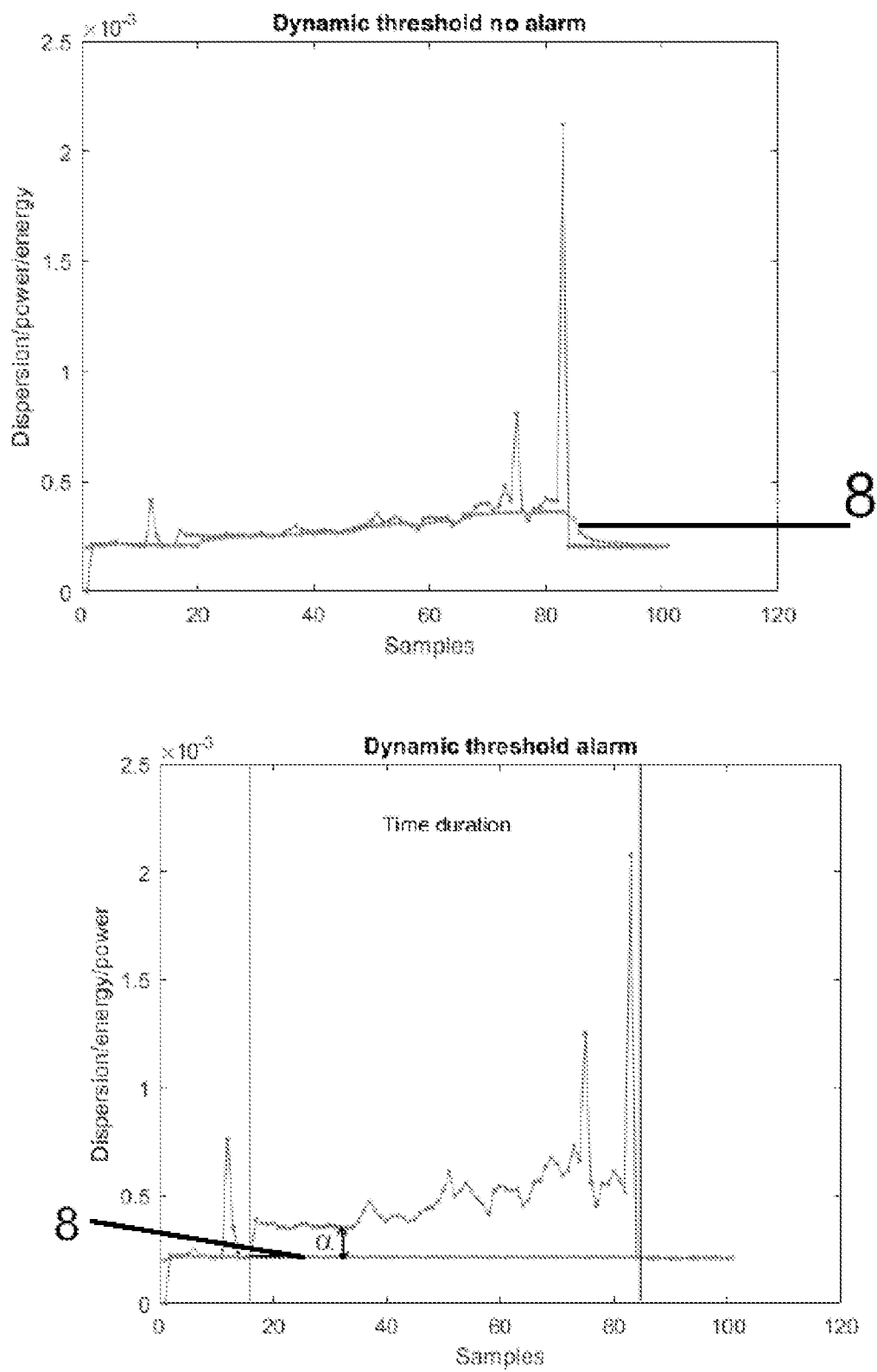
FIG. 3 shows an example of the parameter that sets the threshold of a signal for two different frequency bands for the arc duration time.

FIG. 3 discloses a block diagram of a system according to an embodiment of the invention. An analysis and processing signal stage, where the raw data measured by the ILS is prepared for the processing unit (5).

A database (3) houses preset information that will aid the processing unit to evaluate if the signal captured by the sensor (2) is an arc or is not, discriminating false trips. In an embodiment the database (3) comprises:

a time threshold setting the trigger of an alarm, and status signals of events occurring in aircraft normal operation procedures.

For instance, discrete signals alerting about any other normal operation of the aircraft that could lead a false trip, i.e.: engine starting, particular load switching, EMI, etc.

In an embodiment, the processing unit (5) is configured to calculate from the conditioned signal measured by the sensor (2) the statistical dispersion of the high-frequency magnetic fields of the current pulses in the time domain by the standard deviation or the root mean square or the variance or the power or the energy of the high frequency magnetic fields of the current pulses.

The threshold (8) under no arc-conditions may be a dynamic threshold (8). In an embodiment, for calculating the dynamic threshold (8) under no arc-conditions the processing unit (5) is configured to calculate the moving average of the statistical dispersion of the high-frequency magnetic fields of the current pulses of the conditioned previous signals measured by the sensor (2). Particularly, the processing unit (5) may be configured to update the dynamic threshold (8) using an average of k past measured signals.

As previously stated, alternatively the processing unit (5) may be configured to calculate a regression or a filter of the statistical dispersion of the high-frequency magnetic fields of the current pulses of the conditioned previous signals measured by the sensor (2).

The database (3) may be configured to update over the useful life of the aircraft the time threshold and/or the status signal of events due to normal operation procedures.

A processing unit (5) may be configured to use the database of events to check if the threshold flags are compatible with the events due to normal operation conditions that has been activated by the aircraft, for instance, to an engine starting, to check with the aircraft computer if an engine has been started.

In an embodiment, the processing unit (5) is configured to divide the signal received from the sensor (5) in different n frequency sub-bands.

The number n of sub-bands depends on the frequency content of the input signal, cable length, interferences and the installation topology.

As previously stated, in an embodiment, the threshold (8) under no arc-conditions is a dynamic threshold (8) and the processing unit (5) is configured to calculate the moving average of the statistical dispersion of the high-frequency magnetic fields of the current pulses of the conditioned previous signals measured by the sensor (2).

Particularly, the processing unit (5) is configured to update the dynamic threshold (8) using an average of k past measured signals.

The processing unit (5) calculates the standard deviation, root mean square, variance, power or energy of the sub-bands or other magnitude to measure the dispersion of the data to set the dynamic threshold (8) level. In this stage the threshold (8) is updated along time using the average of k past samples. The number k depends on the capability of adaptation to sudden changes. On the other hand, it is calculated if the instantaneous value of the parameter is above the dynamic threshold (8) during a set period of time (this period of time could vary depending on the network characteristics and is established taking in mind a compromise between fast response and reliability).

If the signal received from the sensor (2) is divided into different n frequency sub-bands, the processing unit (5) is configured to check if the statistical dispersion of the high-frequency magnetic fields of the current pulses of the conditioned signal measured by the sensor (2) are above the threshold (8) under no arc-conditions during the time threshold in at least a frequency sub-band.

For instance, the band of frequencies up to 10 MHz could be divided in four sub-bands to calculate the variations of the parameterization of the pulses along time. As previously stated, an active arc is characterized by high frequency current pulses, so it is possible to detect sudden changes in the dispersion in the sub-bands that are sustained in time for at least tens of milliseconds. This is an efficient way to discard periodic interferences, conventional commutation of switches or bursts and focus on the fact that an arc has that particular fingerprint. The processing unit (5) is configured to decide if the change in the dispersion in the sub-bands surpasses the dynamic threshold defined by the characteristics of the current under no-arc conditions.

Thus, the processing unit (5) is configured to calculate if the statistical dispersion of at least a band is above the dynamic threshold (8) during the period of time.

Additionally, the database (3) may comprise a parameter (a). The parameter (a) allows the processing unit (5) to check if the statistical dispersion of the high-frequency magnetic fields of the current pulses of the conditioned signals measured by the sensor (2) are a parameter (a) above the threshold (8) under no arc-conditions during the time threshold received from the database (3). Thus, the measured signal is above the threshold (8) a set amount determined by the parameter (a) as it is depicted, for instance, in FIG. 3.

Figure 4:
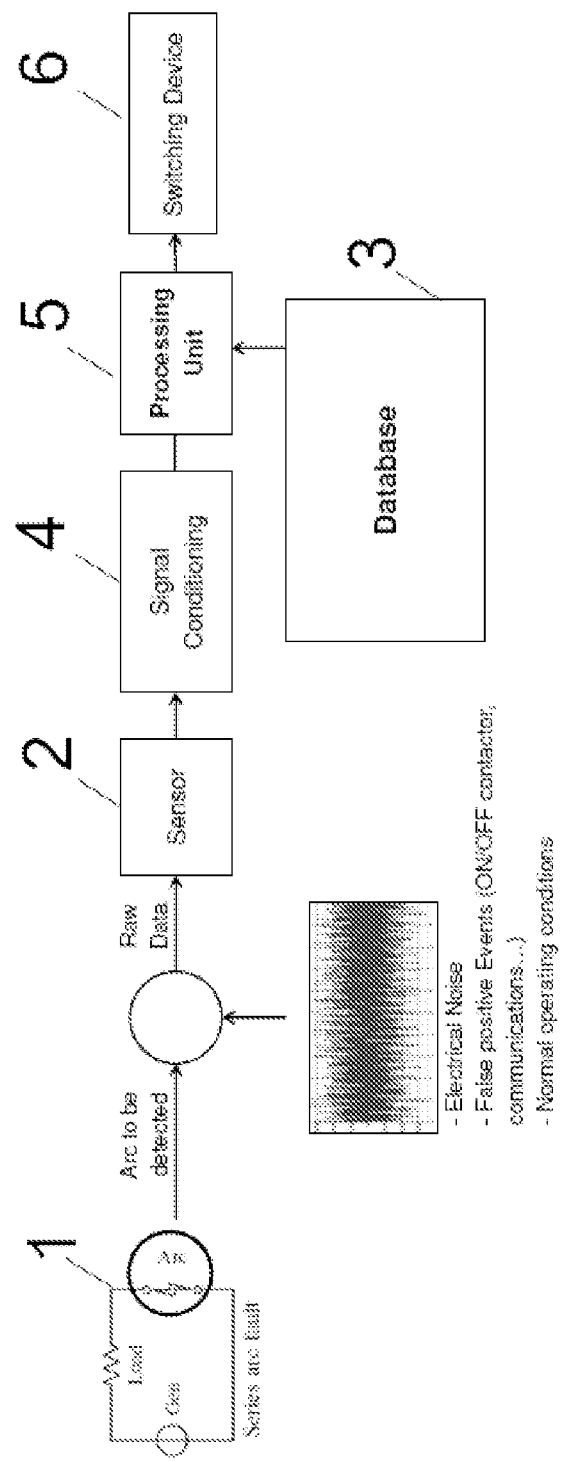
FIG. 4 shows a block diagram of a system according to an embodiment of the invention.
Figure 5:
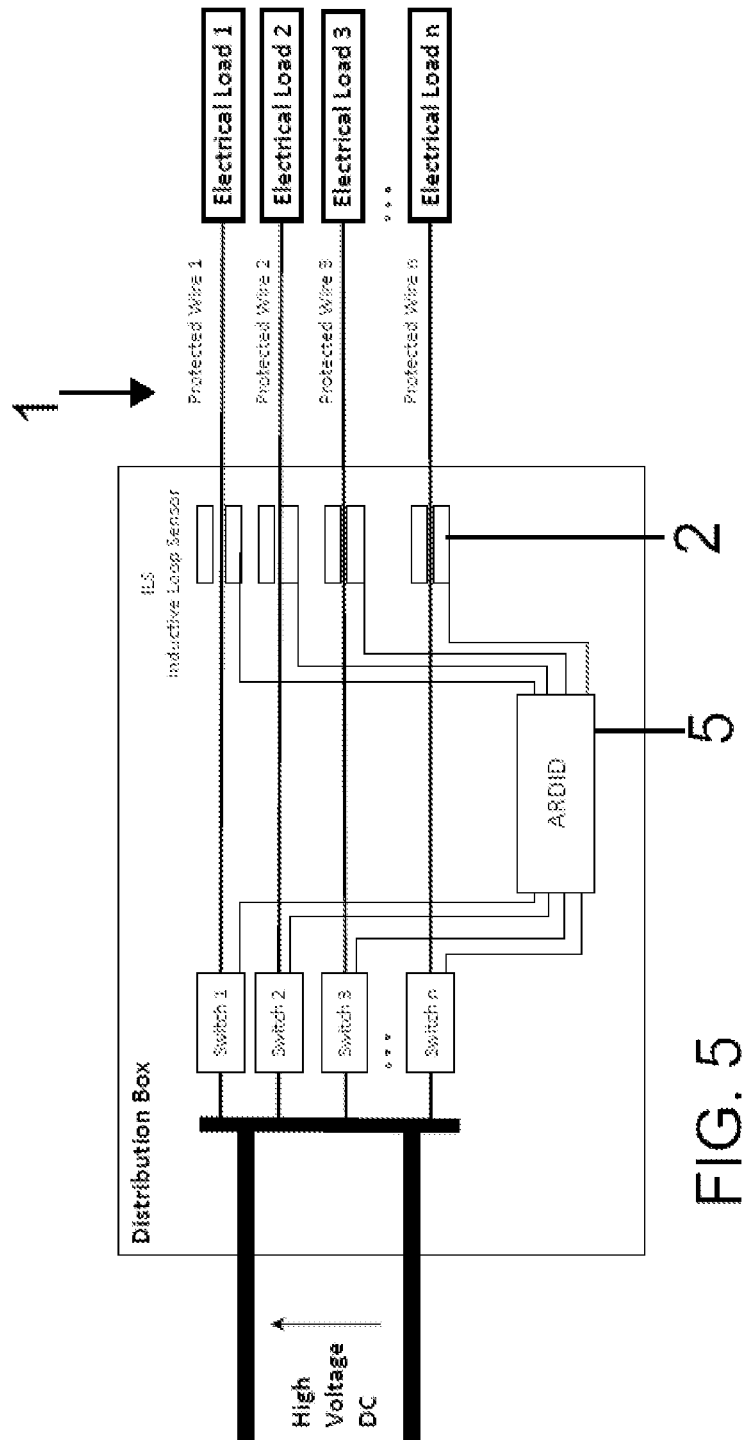
FIG. 5 shows a block diagram of a system according to an embodiment of the invention integrated in a distribution box of an electrical circuit of an aircraft.
Figure 6:
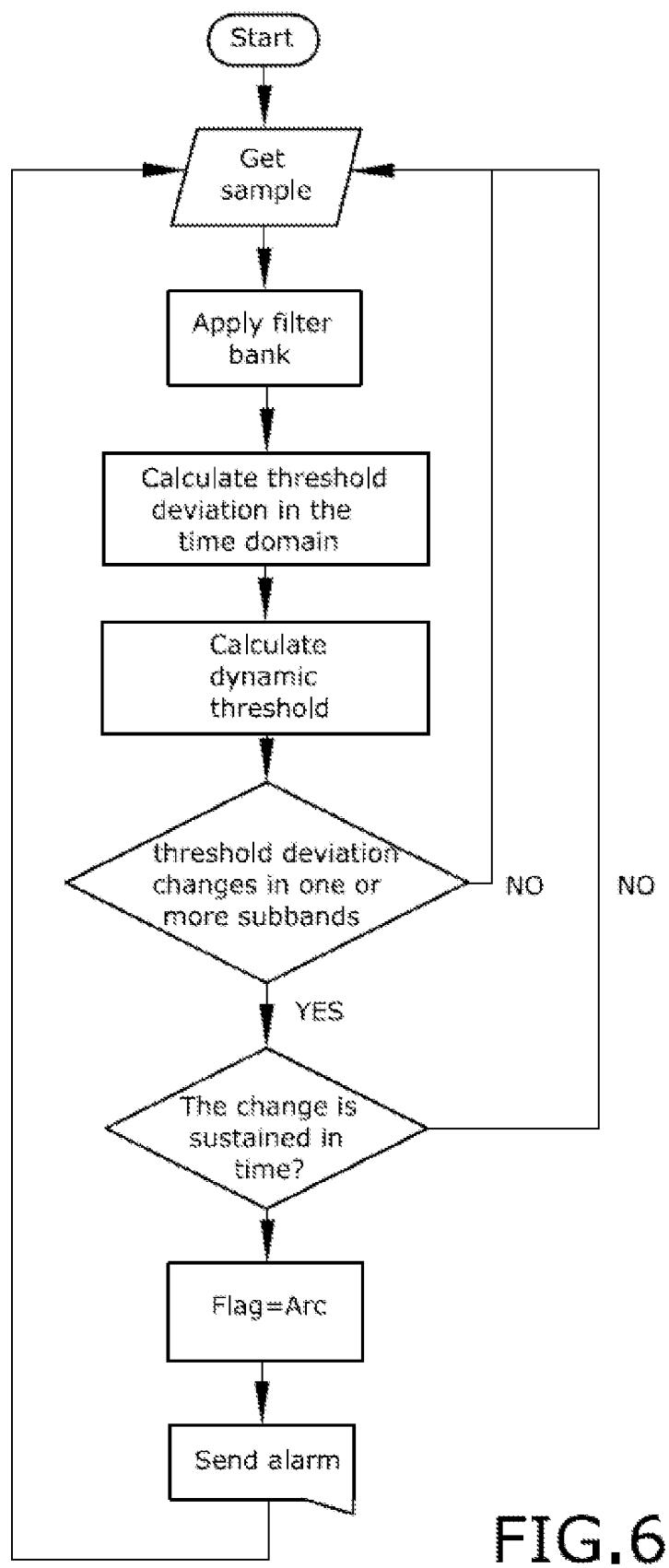
FIG. 6 shows a flow chart of an embodiment of the process performed by the processing unit.

In an embodiment, the claimed system is configured to be integrated on the printed circuit board (PCB) of a distribution box of an aircraft close to the wires, enhancing the sensibility of other air-cored sensors. An embodiment scheme is shown in FIG. 4.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An arc detection system for an aircraft voltage and direct current electrical circuit, the arc detection system comprising:
    a sensor configured to measure an analog signal of high-frequency magnetic fields created by current pulses of an electrical signal flowing through the aircraft voltage and direct current electrical circuit,
    a signal conditioning block comprising an analog to digital converter for converting the analog signal measured by the sensor into a conditioned signal being a digital signal,
    a database comprising:
        a time threshold,
        status signals of events occurring in aircraft normal operation procedures,
    a processing unit configured to receive:
        the conditioned signal measured by the sensor,
        the time threshold from the database, and the status signals of events due to aircraft normal operation procedures from the database, the processing unit being configured to:
- calculate a statistical dispersion of the high-frequency magnetic fields of the current pulses in a time domain of the conditioned signals measured by the sensor,
- calculate a threshold under no-arc conditions as a function of the statistical dispersion of the high-frequency magnetic fields of the current pulses of conditioned previous signals measured by the sensor,
- check if the statistical dispersion of the high-frequency magnetic fields of the current pulses of the conditioned signals measured by the sensor are above the threshold under no arc-conditions during the time threshold received from the database,
- check from the database if any status signal of events due to normal operation procedures has been activated, when the statistical dispersion of the high-frequency magnetic fields of the current pulses in the time domain of the conditioned signals measured by the sensor are above the threshold under no arc-conditions during the time threshold, wherein the status signal of events due to normal operation procedures pertains to one or more of conventional load switching, transients from power electronics devices, radiated noise, load connections, load impedance changes, and engine starting, and
- activate the operation of an electrical protection of the aircraft voltage and direct current electrical circuit if no status signal of events due to normal operation procedures has been activated and the statistical dispersion of the high-frequency magnetic fields of the current pulses in the time domain of the conditioned signals measured by the sensor are above the threshold under no arc-conditions during the time threshold,
- wherein the database is configured to update over a useful life of the aircraft at least one of a time threshold and a status signals of events due to normal operation procedures.

2. The arc detection system for an aircraft voltage and direct current electrical circuit, according to claim 1, wherein the processing unit is configured to calculate from the conditioned signal measured by the sensor the statistical dispersion of the high-frequency magnetic fields of the current pulses in the time domain by a standard deviation or a root mean square or a variance or power or energy of high frequency magnetic fields of the current pulses.

3. The arc detection system for an aircraft voltage and direct current electrical circuit, according to claim 1, wherein the threshold under no arc-conditions is a dynamic threshold.

4. The arc detection system for an aircraft voltage and direct current electrical circuit, according to claim 3, wherein the processing unit is configured to calculate a moving average of the statistical dispersion of the high-frequency magnetic fields of the current pulses of the conditioned previous signals measured by the sensor.

5. The arc detection system for an aircraft voltage and direct current electrical circuit, according to claim 3, wherein the processing unit is configured to calculate a regression or a filter of the statistical dispersion of the high-frequency magnetic fields of the current pulses of the conditioned previous signals measured by the sensor.

6. The arc detection system for an aircraft voltage and direct current electrical circuit, according to claim 1, wherein the processing unit is configured to divide the signal received from the sensor in different n frequency sub-bands.

7. The arc detection system for an aircraft voltage and direct current electrical circuit, according to claim 6, wherein the processing unit is configured to check if the statistical dispersion of the high-frequency magnetic fields of the current pulses of the conditioned signal measured by the sensor are above the threshold under no arc-conditions during the time threshold in at least a frequency sub-band.

8. The arc detection system for an aircraft voltage and direct current electrical circuit, according to claim 1, wherein the signal conditioning block comprises a filter configured to select a band of frequencies ranging up to 50 MHz from the signal measured by the sensor and configured to feed the processing unit.

9. The arc detection system for an aircraft voltage and direct current electrical circuit, according to claim 1, wherein the sensor is an inductive loop sensor.

10. The arc detection system for an aircraft voltage and direct current electrical circuit, according to claim 1, wherein the arc detection system is configured to be integrated on a printed circuit board of a distribution box of an aircraft.

11. The arc detection system for an aircraft voltage and direct current electrical circuit, according to claim 1, wherein the database comprises a parameter and the processing unit is configured to check if the statistical dispersion of the high-frequency magnetic fields of the current pulses of the conditioned signals measured by the sensor are a parameter above the threshold under no arc-conditions during the time threshold received from the database.

12. An arc detection method for an aircraft voltage and direct current electrical circuit, the arc detection method comprising the following steps:
- measuring by a sensor an analog signal of high-frequency magnetic fields created by current pulses of an electrical signal flowing through the aircraft voltage and direct current electrical circuit,
- converting the analog signal received from the sensor into a conditioned signal comprising a digital signal,
- sending the conditioned signal to a processing unit,
- calculating in the processing unit a statistical dispersion of the high-frequency magnetic fields of the current pulses in the time domain of the conditioned signals measured by the sensor,
- calculating in the processing unit a threshold under no-arc conditions as a function of the statistical dispersion of the high-frequency magnetic fields of the current pulses of the conditioned previous signals measured by the sensor,
- checking in the processing unit if the statistical dispersion of the high-frequency magnetic fields of the current pulses conditioned signals measured by the sensor are above the threshold under no arc-conditions during a time threshold received from a database,
- checking if any status signals of events due to normal operation procedures from the database has been activated, wherein the status signal of events due to normal operation procedures pertains to one or more of conventional load switching, transients from power electronics devices, radiated noise, load connections, load impedance changes, and engine starting, when the statistical dispersion of the high-frequency magnetic fields of the current pulses in a time domain of the conditioned signals measured by the sensor are above the threshold under no arc-conditions during the time threshold, and activating the operation of an electrical protection of the aircraft voltage and direct current electrical circuit if no status signal of events due to normal operation procedures has been activated and if the statistical dispersion of the high-frequency magnetic fields of the current pulses in the time domain of the conditioned signals measured by the sensor are above the threshold under no arc-conditions during the time threshold, wherein the database is configured to update over a useful life of the aircraft at least one of a time threshold and a status signals of events due to normal operation procedures.

\* \* \* \* \*